United States Patent [19]

Renous

[11] Patent Number: 4,847,724
[45] Date of Patent: Jul. 11, 1989

[54] OVERVOLTAGE PROTECTED INTEGRATED CIRCUIT

[75] Inventor: Claude Renous, Grenoble, France

[73] Assignee: SGS-Thomson Microelectronics S.A., France

[21] Appl. No.: 163,021

[22] Filed: Mar. 2, 1988

[30] Foreign Application Priority Data

Mar. 27, 1987 [FR] France ................................ 87 04270

[51] Int. Cl.$^4$ ............................................. H02H 3/20
[52] U.S. Cl. ....................................... 361/91; 361/56; 361/111; 361/119; 357/13; 379/412
[58] Field of Search ...................... 361/86, 88, 91, 111, 361/119, 117, 118, 56; 379/412; 357/13

[56] References Cited

U.S. PATENT DOCUMENTS

| | | | |
|---|---|---|---|
| 3,858,062 | 1/1975 | Davis | 357/35 X |
| 3,911,296 | 10/1975 | Davis | 328/167 X |
| 4,005,342 | 2/1977 | Davis | 307/10 R X |
| 4,024,417 | 5/1977 | Heuber et al. | 307/303 |
| 4,661,979 | 4/1987 | Jakab | 361/91 X |

Primary Examiner—Derek S. Jennings
Attorney, Agent, or Firm—Lowe, Price, LeBlanc, Becker & Shur

[57] ABSTRACT

The circuit relates to the protection of some integrated circuits connected with transmission lines and therefore liable to be subject to overvoltages. The protection comprises diodes (D1, D2, D3). Those diodes switch towards an internal supply conductor (CA) either the external supply voltage VBAT, or the overvoltage possibly present on an output terminal (A) if said overvoltage is higher than the internal supply voltage. The diodes have a special structure, that is they are formed from junctions between regions electrically insulated from the epitaxial substrate on which the integrated circuit is formed. The invention applies in particular to subscriber line interface circuits.

9 Claims, 3 Drawing Sheets

OVERVOLTAGE PROTECTED INTEGRATED CIRCUIT

TECHNICAL FIELD

The instant invention relates th integrated circuits and more specifically to the protection of such circuits against overvoltages liable to impair their operation or to destroy them.

The invention will be described more specifically with respect to an integrated circuit interfacing a telephone exchange and a subscriber telephone set; however the invention is not limited to such circuits.

Such an interface circuit, or subscriber line interface circuit (SLIC), is connected between the telephone exchange and two telephone line leads L1 and L2 (refer to FIG. 1); at the opposite end of the line is connected a subscriber telephone set (TEL).

The line leads extend on large distances and are therefore subject to perturbations liable to generate overvoltages on such leads.

For example, the overvoltages originate from lightnings, various electromagnetic inductions, unwished contacts with electrical energy transport lines, etc.

In all those cases, the energy levels are very high and the circuits connected to the line extremities must be highly protected.

The first protection consists in arranging arresters ECL1 and ECL2 between each line lead and the ground.

The second protection consists in serially connecting a positive temperature coefficient resistor (CTP1, CTP2), in each line lead for suppressing the destructive current overloads: if a current overload arises, the temperature of said resistors and therefore their resistance is largely increased (for example the resistance increases from 30 ohms to some megohms) whereby the current is interrupted.

The third protection consists in arranging between each line conductor and the ground protection electronic components of the type Zener diode or thyristor without gate. Those components, TR1, TR2, have a high impedance as long as the voltage is not higher than a given threshold Vz; then, those components are conductive and the current flows towards the ground when the voltage is over the threshold voltage Vz; the voltage at the terminals of those components remains equal to Vz in case of a Zener diode; this voltage drops at a very low value in case of a thyristor without gate. The components TR1, TR2, are generally arranged between an output terminal A or B of the integrated circuit constituting the SLIC and the ground; the terminals A and B are connected to the line leads through positive temperature coefficient resistors.

The choice of the value Vz is critical in the practical application for reasons which will be explained hereinafter and that are associated both to the supply mode of the SLIC and to the technical implementation of the integrated circuit.

It will be first appreciated that it is wished to avoid that the terminal A or B receives a potential higher than an absolute voltage withstand threshold of the integrated circuit: for example, this threshold is VMAX=110 volts (tolerable threshold between the terminal A or B and the ground). Above this threshold, there will be a breakdown of the junctions internal to the integrated circuit.

Therefore, Vz has to be lower than VMAX.

Additionally, the SLIC is fed by a d.c. voltage VBAT negative with respect to the ground, this voltage appearing possibly sometimes during the normal operation of the circuit on the terminals A and B.

The voltage VBAT has a rated value of 48 volts (in fact, it is a negative value of −48 volts, but, until the explanations corresponding to FIG. 2, it is simpler to refer to absolute values).

Additionally, the supply voltage can vary between two values (in absolute value)

VBATmin=34 volts and VBATmax=72 volts without impairing the operation of the circuit.

It is therefore necessary that the breakdown voltage Vz of the protection components be at least equal to VBATmax failing which the protection components should trigger even in certain normal operation cases of the circuit.

Therefore, the components TR1 and TR2 have to be chosen with a triggering voltage Vz comprised between VBATmax and VMAX, that is in the given example, between 72 volts and 110 volts.

It is then possible to have a misoperation of the circuit liable to cause the destruction of the integrated circuit, for a reason associated with the manufacturing technology of the integrated circuit, as will be explained in connection with FIG. 2; this figure is a schematical cross section of a part of an integrated circuit structure of the type occuring in a SLIC.

Due to the relatively high voltages liable to be applied the circuit, this one is carried out according to a bipolar technology on an p-type silicon substrate 10 covered with an n-type epitaxial layer 12. The epitaxial layer is divided into boxes insulated from each other by deep p-type diffusions 14 which originate from the upper surface of the layer and attain the substrate. N+-type buried layers 16 can be provided under each box, between the epitaxial layer 12 and the substrate, and those buried layers can be connected with the upper surface through deep n+-type diffusions 18.

One transistor is manufactured in each box and is insulated from the neighbouring transistors or other elements of the circuit by the insulation p-type diffusions 14.

FIG. 2 shows as an example, an output transistor of the SLIC, the collector of which is comprised of a metal contact C1 at the surface of an n+-type diffusion 18 and the emitter and the base of which correspond to other surface contacts E1 and B1 on suitable emitter and base areas of a first box 20. FIG. 2 also shows another transistor of the same structure (E2, B2, C2) in another box 22.

For example, the collector C1 is connected with the output terminal A of the integrated circuit (cf. FIG. 1), the collector C2 is connected with the terminal B, and the supply voltage VBAT is applied to an output terminal D. Conventionally, the terminal D is connected (inside the integrated circuit) with a metal contact 24 formed over a deep p-type diffusion 14 which attains the substrate, so that the negative supply potential VBAT is applied to the substrate.

The application of a negative potential to the substrate is conventional for integrated circuits manufactured in an n-type epitaxial layer formed on a p-type substrate; indeed, by connecting the p-substrate to the more negative potential, it is ascertained that the potentials of all the other parts of the integrated circuit, and in particular of all the n-type regions adjacent to the substrate or to the insulating diffusions, will be higher than the potential of the substrate and of those diffusions. Thereby, the insulating diffusions are suitably negatively biased with respect to the regions they have to insulate, and this condition is necessary for obtaining correctly the insulation function.

However, those insulation functions are liable not to be maintained in case of negative overvoltages applied to the terminals A and B if those overvoltages get higher, in absolute value, than the potential VBAT of the substrate.

In fact, in this case, the insulation diffusions get directly biased; they cause a conduction of the parasitic transistors between adjacent boxes, whereby a current flows that may cause the destruction of the circuit.

This condition risks to occur if the triggering voltage Vz has been chosen between VBATmax and VMAX, as it results from the above indications. For example, if Vz is chosen equal to or slightly higher than VBATmax and an overvoltage lower than VBATmax (72 volts) arises while the supply voltage has for example its rated value VBAT, the protection component TR1 or TR2 will not be triggered and however, the voltage on the terminal A (between VBAT and VBATmax) will be more negative than the substrate potential (VBAT), causing the above-mentioned defect.

Therefore, there is an inconsistency between the various protection necessities and the fact that the supply voltage may vary in a large range.

SUMMARY OF THE INVENTION

For palliating this drawback, the instant invention provides for an integrated circuit protected against overvoltages, this circuit being carried out onto a semiconductive substrate of a first conductivity type, covered with an epitaxial layer of the opposite conductivity type, the circuit comprising at least one external supply terminal, internal supply terminals for transmitting a supply voltage to the various components of the circuit, and at least one output terminal liable to receive overvoltages. According to the invention, the integrated circuit comprises a first diode connected between the substrate and the external supply voltage, its cathode being connected with said terminal if the substrate is p-type; a second diode connected between the internal supply conductors and the external supply terminal, its cathode being connected with said terminal if the substrate is p-type; and a third diode connected between the internal supply conductor and the output terminal, having its cathode connected with said terminal if the substrate is p-type, said third diode being implemented by means of a junction between two regions of opposite conductivity types, both being electrically insulated from the substrate, and the anodes of the first and second diodes corresponding to p-regions insulated from the substrate.

Hereinabove, the term substrate insulator regions means that an insulation by a reverse biased junction is provided, but, in particular techniques, it would be also possible to provide for a dielectric insulation without departing from the scope of the invention.

BRIEF DESCRIPTION OF THE DRAWINGS

These features and advantages and others of the invention will be more apparent from the following detailed description in reference with the attached drawings wherein.

DETAILED DESCRIPTION OF THE INVENTION

Figure 3:
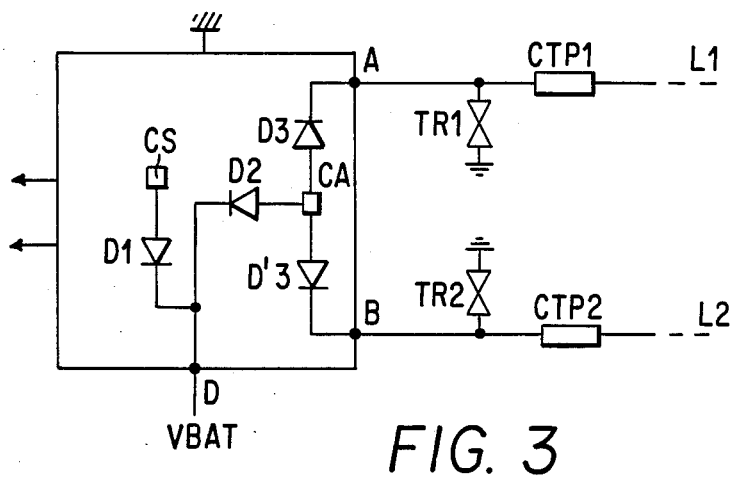
FIG. 3 shows a circuit diagram for explaining the protection principle according to the invention.

FIG. 3 shows the main features of the invention in connection with a SLIC as above explained. The supply voltage VBAT of the exchange is applied to an output terminal D of the integrated circuit, but this terminal is not directly connected with the substrate. On the contrary, it is connected with the substrate through a diode D1, the cathode of which is connected with the terminal D and the anode of which is connected with a contact CS directly connected with the substrate.

In the following, it will be considered that the substrate is p-type and the epitaxial layer is n-type; otherwise, the terms anode and cathode should be inverted.

Additionally, terminal D does not apply directly the supply voltage VBAT to the various components constituting the SLIC; on the contrary, the supply voltage common to those components is provided through a conductor internal to the integrated circuit, designated by a contact CA on FIG. 3, and this conductor is connected with terminal D through a diode D2, the anode of which is connected with the internal conductor CA and the cathode of which is connected with terminal D.

Finally, a diode D3 is provided so that its anode is connected with conductor CA and its cathode with the output terminal A of the integrated circuit (terminal liable to receive an overvoltage); similarly, a diode D'3 has its anode connected with the internal supply conductor CA and its cathode connected with the output terminal B of the integrated circuit.

This set of diodes operates as a switch for applying to the internal supply conductor and to the substrate the most negative of the three following voltages:
 external supply voltage VBAT (that may vary for example between $-34$ volts and $-72$ volts),
 overvoltage possibly present on terminal A,
 overvoltage possibly present on terminal B.

In the absence of an overvoltage, the supply voltage VBAT is transmitted—minus the voltage drop in diode D1—onto the substrate; it is also transmitted—minus the voltage drop in diode D2—onto the internal supply conductor CA. Then, diodes D1 and D2 are forward biased, but it is provided that the anode of diode D1, although connected to the substrate and although p-type as the substrate, is not made of a part of the substrate nor a p-type region directly adjacent to the substrate; on the contrary, the anode of diode D1 is a p-type region arranged in an n-type box, and the cathode of diode D1 is constituted not by this n-box but by an n-type region inside the p-type region constituting the anode.

Accordingly, the forward bias of diode D1 does not involve an unwished forward bias between the substrate and the various insulation boxes of the integrated circuit.

In the presence of an overvoltage (having an absolute value higher than VBAT) on one of the output terminals accordingly protected, for example terminal A, diodes D1 and D2 are reverse biased and diodes D3 and D4 are forward biased, thus applying an overvoltage to the internal supply conductor CA (minus the voltage drop in diode D3). The conductor CA gets accordingly the most negative point of the circuit. In fact, the substrate has the same potential as this conductor CA through a diode, not shown on FIG. 3, constituted by the junction between the n-box on which is taken the output contact A and the substrate. An unwished forward bias of a junction between a box and the substrate arises, but only a low current may flow through this junction because the main current flows between the conductor CA and the terminal A through diode D3. This low current cannot cause the conduction of the parasitic transistors and a fortiori not the destruction of the circuit. As regards diode D3, this diode is insulated with respect to the substrate because on the one hand its anode is not adjacent to a substrate portion and on the other hand its cathode is not adjacent to an n-box adjacent to the substrate; when a high current flows in this diode, this one does not cause the adverse conduction of a junction between the substrate and a box adjacent to the substrate.

Figure 4:
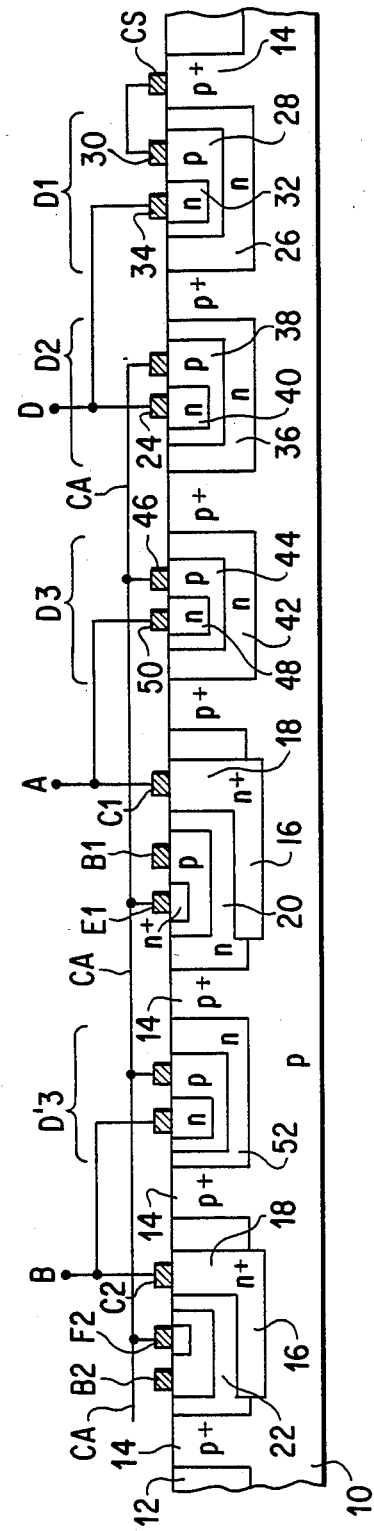
FIG. 4 and are cross-section views of an integrated circuit implementing this protection.
Figure 5:
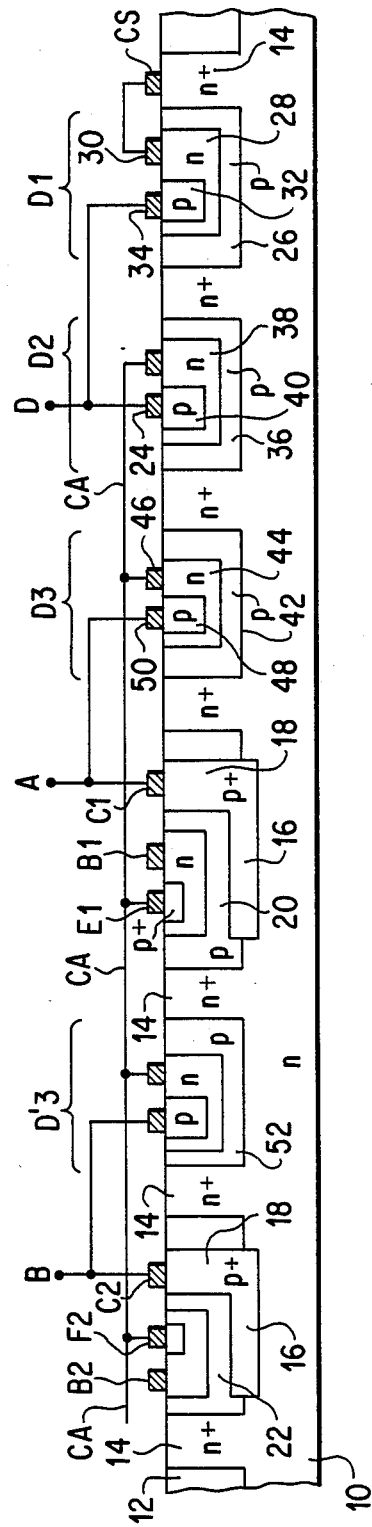

FIG. 4 shows an example of an integrated circuit implementing this protection principle, always in the above application to a SLIC. The references used are the same as in the former drawings for the same elements.

The structure is carried out on a p-type substrate 10 covered with an n-type epitaxial layer 12.

P+-type insulation diffusions 14 extend from the upper surface of the epitaxial layer down to the substrate. N-type boxes are delimited by those insulation diffusions are accordingly fully insulated the ones from the others. N+-type buried layers 16 can be provided as in FIG. 2 under some boxes, between the box and the substrate. Access wells 18 to those buried layers can also be provided for.

Referring to FIG. 4, output terminals A and B of the integrated circuit are shown as contacts C1 and C2 with n+-type regions constituting collector regions for output transistors of the circuit. Those transistors are arranged in respective boxes 20 and 22.

The external supply terminal D of the integrated circuit is shown as a contact 24 on the upper surface of the circuit. This terminal receives the voltage VBAT.

Figure 1:
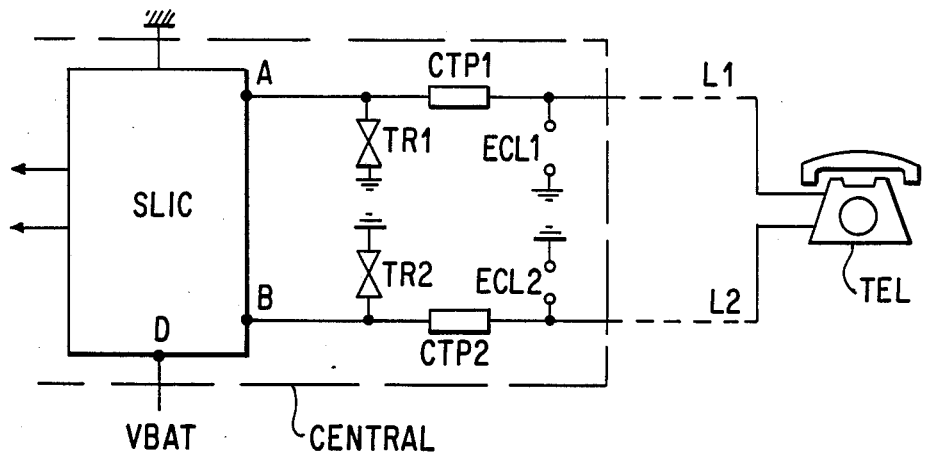
FIG. 1, already described, shows an example of an application circuit wherein an integrated circuit protection problem arises.
Figure 2:
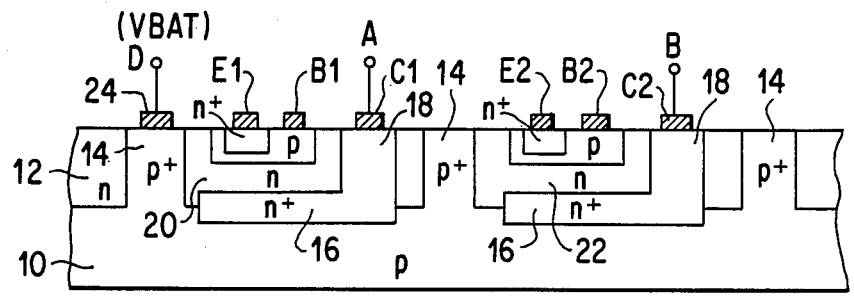
FIG. 2 shows a cross-section of a conventional structure of an integrated circuit.

The above corresponds to the structure elements that have not changed from FIG. 2 to FIG. 4.

The specific elements of the invention are the following ones.

A diode D1 is formed in a box 26 insulated from the other boxes.

The anode of diode D1 is made of a p-type region 28 diffused in the box 26. This anode region 28 is fully insulated from the substrate by the surrounding box 26. A direct electric connection is carried out between this anode and the substrate, for example by means of an electrical contact 30 on the surface of region 28, a contact CS on the upper surface of an insulation diffusion 14, and a metal connection between those two contacts.

The cathode of diode D1 is constituted of an n-type diffusion 32 formed in the p-type diffusion 28; a contact 34 is formed on the upper surface of region 32 and is connected through a metal conductor to terminal D.

A diode D2 is formed in a box 36. Its anode is made of a p-type diffusion 38, insulated from the substrate and from the insulation diffusions through the surrounding box 36. A direct conductive connection is made between this region 38 and an internal supply conductor CA that provides to the whole circuit the negative supply voltage necessary to the operation thereof. The cathode of diode D2 corresponds to an n-type region 40, diffused inside the p-type region 38. A contact (for example 24) with this cathode region 40 permits to connect the anode of diode D2 with terminal D.

A diode D3 is formed in a box 42 insulated from other boxes. The anode of diode D3 corresponds to a p-type region 44 diffused in box 42. A contact 46 connects this anode to the internal supply conductor CA.

The cathode of diode D3 is formed by an n-type diffusion 48 formed in the p-type region 44 and a contact 50 is formed on the upper surface of the cathode 48, this contact being connected through a conductor to the output terminal A.

Finally, as terminal B must also be protected in this application example, a diode D'3 similar to diode D3 is formed in a box 52, this diode D'3 having its anode connected with the internal supply conductor CA and its cathode connected with the output terminal B.

This embodiment has been indicated only as an example and it would be possible to provide more sophisticated structures for the diodes D1, D2, D3, D'3. For example, the implementation could be the following one: an n-type buried layer is provided under a box; it is converted, but only on a part of its length, with a p-type buried layer; a p-type ring is diffused from the upper surface down to the p-type buried layer; this ring surrounds an n-type region that constitutes the cathode of the diode and on which a cathode contact can be formed; the anode contact can be formed on the p-type ring, this ring constituting the anode.

I claim:

1. An integrated circuit having overvoltage protection of an output terminal, comprising:
   a semiconductor substrate of a first conductivity type;
   an epitaxial layer of the opposite conductivity type covering said semiconductor substrate;
   an external supply signal input terminal for receiving an externally applied supply voltage potential;
   an internal power supply bus for providing a supply voltage to components of said integrated circuit;
   a first diode formed in said semiconductor substrate and connected between said semiconductor substrate and said external supply signal input terminal;
   a second diode formed in said semiconductor substrate and connected between said internal supply bus and said external supply signal input terminal; and
   a third diode formed in said semiconductor substrate including first and second regions of opposite conductivity types, said first and second regions electrically insulated from said semiconductor substrate, said third diode connected between said internal supply bus and said output terminal.

2. An integrated circuit according to claim 1, wherein said first region of said third diode comprises a p-type anode region formed in an n-type box and said second region of said third diode comprises an n-type cathode region formed within said p-type anode region.

3. An integrated circuit according to claim 1, wherein said first and second diodes each comprise a first and second regions of opposite conductivity types electrically insulated from said semiconductor substrate.

4. An integrated circuit having overvoltage protection of output terminal means, comprising:
a p-type semiconductor substrate;
an n-type epitaxial layer covering said semiconductor substrate;
an external supply signal input terminal for receiving an externally applied supply voltage potential;
an internal power supply bus for providing a supply voltage to components of said integrated circuit;
a first diode including a p-type anode region formed in said substrate, an n-type cathode region formed within said first diode anode region and connected to said external supply signal input terminal, and a substrate insulator region surrounding and insulating said first diode anode region from said substrate;
a second diode including a p-type anode region formed in said substrate and connected to said internal power supply bus, an n-type cathode region formed within said second diode anode region and connected to said external supply signal input terminal, and a substrate insulator region surrounding and insulating said second diode anode region from said substrate; and
a third diode including a p-type anode region formed in said substrate and connected to said internal power supply bus, an n-type cathode region formed within said third diode anode region and connected to said output terminal means, and a substrate insulator region surrounding and insulating said third diode anode region from said substrate.

5. An integrated circuit according to claim 4, wherein said output terminal means comprises first and second output terminals, said third diode anode region connected to said first output terminal, said integrated circuit further comprising a fourth diode including a p-type anode region formed in said substrate and connected to said internal power supply bus, an n-type cathode region formed within said fourth diode anode region and connected to said second output terminal, and a substrate insulator region surrounding and insulating said fourth diode anode region from said substrate.

6. An integrated circuit according to claim 4, wherein said substrate insulator region comprises an n-type semiconductor material.

7. An integrated circuit having overvoltage protection of output terminal means, comprising:
an n-type semiconductor substrate;
a p-type epitaxial layer covering said semiconductor substrate;
an external supply signal input terminal for receiving an externally applied supply voltage potential;
an internal power supply bus for providing a supply voltage to components of said integrated circuit;
a first diode including an n-type cathode region formed in said substrate, a p-type anode region formed within said first diode cathode region and connected to said external supply signal input terminal, and a substrate insulator region surrounding and insulating said first diode cathode region from said substrate;
a second diode including an n-type cathode region formed in said substrate and connected to said internal power supply bus, a p-type anode region formed within said second diode cathode region and connected to said external supply signal input terminal, and a p-type semiconductor region surrounding and insulating said second diode cathode region from said substrate; and
a third diode including an n-type cathode region formed in said substrate and connected to said internal power supply bus, a p-type anode region formed within said third diode cathode region and connected to said output terminal means, and a substrate insulator region surrounding and insulating said third diode cathode region from said substrate.

8. An integrated circuit according to claim 7, wherein said output terminal means comprises first and second output terminals, said third diode cathode region connected to said first output terminal, said integrated circuit further comprising a fourth diode including an n-type cathode region formed in said substrate and connected to said internal power supply bus, a p-type anode region formed within said fourth diode cathode region and connected to said second output terminal, and a substrate insulator region surrounding and insulating said fourth diode cathode region from said substrate.

9. An integrated circuit according to claim 7, wherein said substrate insulator comprises a p-type semiconductor region.

* * * * *